United States Patent [19]

Lemelson

[11] Patent Number: 4,859,493
[45] Date of Patent: Aug. 22, 1989

[54] METHODS OF FORMING SYNTHETIC DIAMOND COATINGS ON PARTICLES USING MICROWAVES

[76] Inventor: Jerome H. Lemelson, 48 Parkside Dr., Princeton, N.J. 08540

[21] Appl. No.: 32,307

[22] Filed: Mar. 31, 1987

[51] Int. Cl.[4] .................... B05D 3/02; B05D 7/00; B05D 3/12; B01J 3/06
[52] U.S. Cl. .................... 427/45.1; 427/213; 427/242; 423/446; 118/50.1; 118/730
[58] Field of Search .................... 427/45.1, 213, 242, 427/39; 118/50.1, 730; 423/446

[56] References Cited

U.S. PATENT DOCUMENTS

| 1,965,059 | 7/1934 | Seibt | 118/730 |
|---|---|---|---|
| 3,114,652 | 12/1963 | Schetky | 427/451 |
| 3,213,827 | 10/1965 | Jenkin | 118/730 |
| 3,977,896 | 8/1976 | Bokros et al. | 427/213 |
| 4,116,161 | 9/1978 | Steube | 118/730 |
| 4,397,885 | 8/1983 | Akai et al. | 427/242 |
| 4,615,905 | 10/1986 | Ovshinsky | 427/39 |
| 4,756,964 | 7/1988 | Kincaid et al. | 427/45.1 |
| 4,767,608 | 8/1988 | Matsumoto et al. | 423/446 |

FOREIGN PATENT DOCUMENTS

| 0175980 | 4/1986 | European Pat. Off. | 423/446 |
|---|---|---|---|
| 0063732 | 4/1984 | Japan | 423/446 |
| 0137311 | 8/1984 | Japan | 423/446 |
| 0122796 | 7/1985 | Japan | 423/446 |
| 0191097 | 9/1985 | Japan | 423/446 |
| 0231494 | 11/1985 | Japan | 423/446 |
| 0286299 | 12/1986 | Japan | 423/446 |
| 2138394 | 6/1987 | Japan | 423/446 |

*Primary Examiner*—Shrive Beck
*Assistant Examiner*—Marianne L. Padgett

[57] ABSTRACT

An apparatus and method for applying hard surface coatings to articles of manufacture such as particles, filaments, sphereoids, rollers, bearings, tools, and assemblies. In one form, coating of hard surface film, such as synthetic diamond, is effected while the objects fall freely through space in a coating chamber. In another form, coating is effected while particles are fluidized by gas containing molecules which are formed of matter to be deposited by gas or chemical vapor deposition employing high energy radiation, such as microwave energy and/or other form of radiation. In other forms, an ion beam or beams containing hot carbon ions is directed through a fluidized bed of particles to be coated or through a chamber in which small objects are made to continuously fall freely through space to coat same with carbon in the form of synthetic diamond. In another method, such small objects are caused to continuously tumble through a coating region of a coating chamber into which is directed gas and/or vapor containing molecules of a hydrocarbon, such as methane, and hydrogen, while microwave energy is directed through such region. Other forms of the invention include the selective deposition and coating of synthetic diamond onto substrates to form or protect microminiature electronic circuits and circuit elements such as transistors and interconnects and to protect bonds such as welds, or to form bonds between components joined together thereby. In yet another form, hard synthetic diamond coatings are deposited per se or in combination with other materials, by a hybrid process including chemical vapor deposition, ion deposition by beam(s), sputtering and the like.

9 Claims, 4 Drawing Sheets

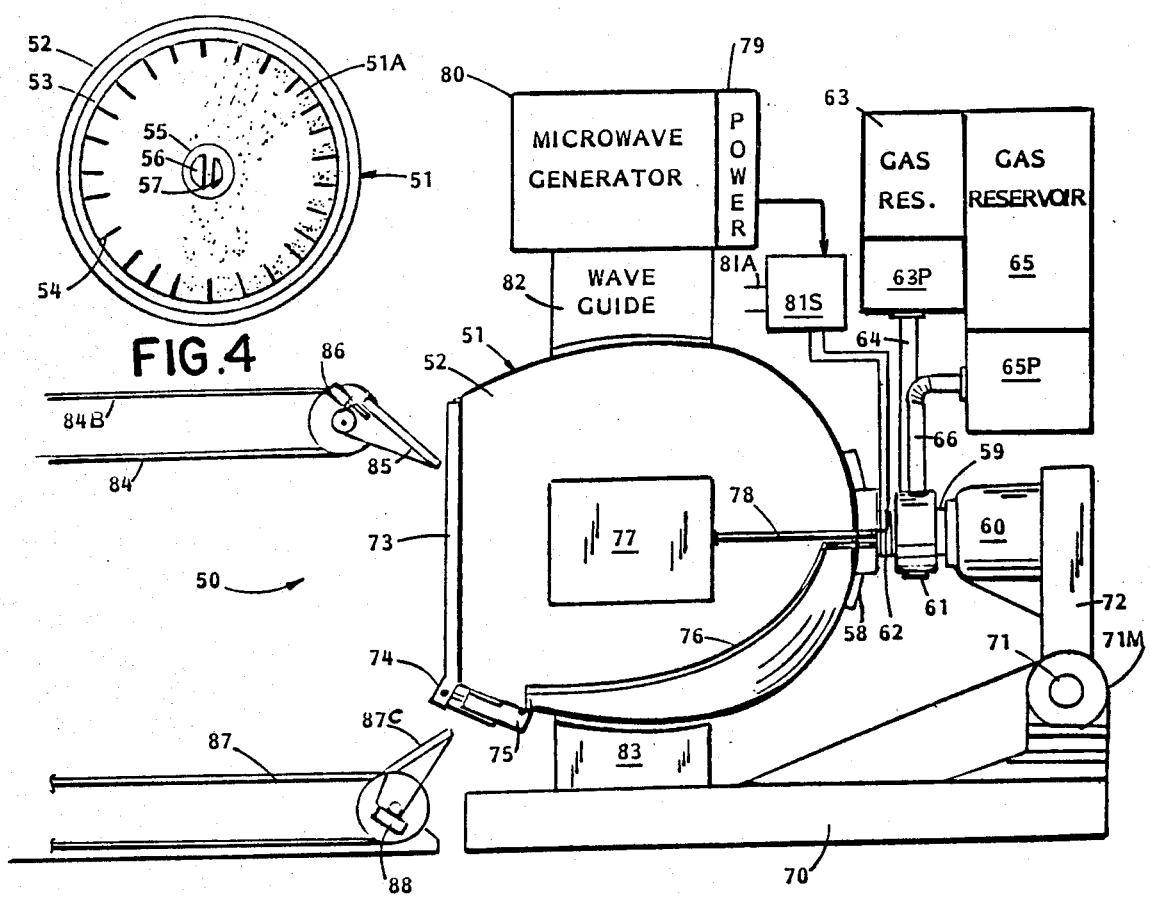
FIG.4
FIG.3
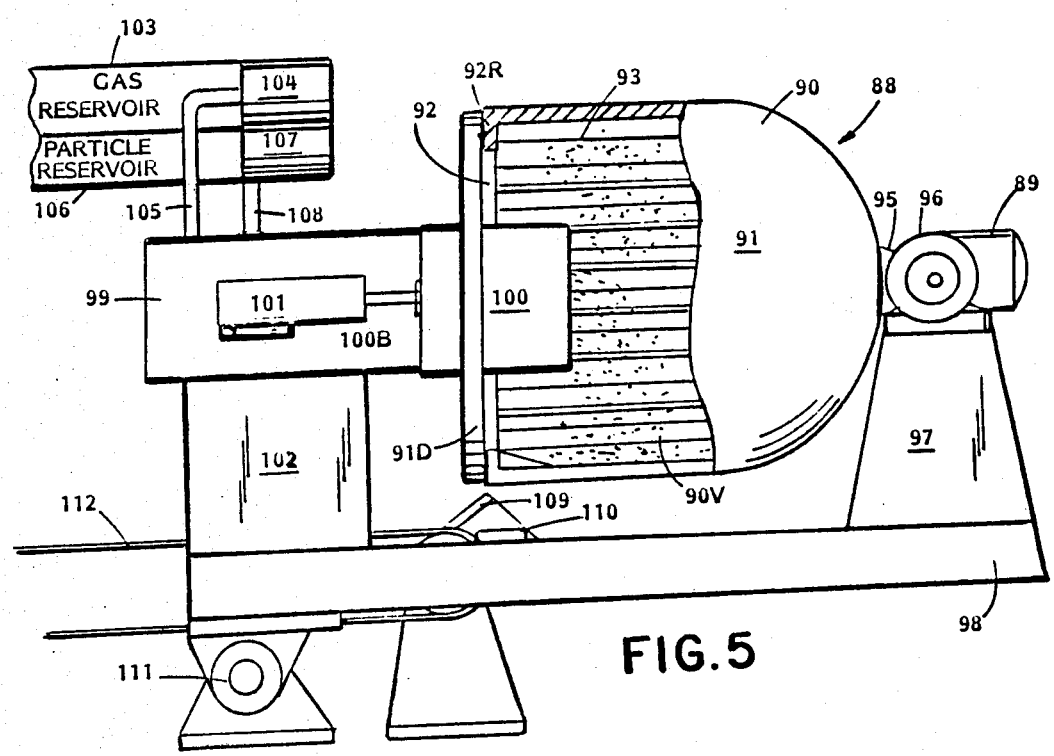
FIG.5

METHODS OF FORMING SYNTHETIC DIAMOND COATINGS ON PARTICLES USING MICROWAVES

FIELD OF THE INVENTION

This invention is in the field of coating articles including small obects or particles with extremely hard surfacing material, such as synthetic diamond formed from carbon atoms utilizing microwave radiation to pyrolize or strip the carbon atoms from their gas molecules.

THE PRIOR ART

The prior art employs various processes to coat carbon as thin films of synthetic diamond or diamond-like material onto flat substrates such as such as sample and test plates, and the like. U.S. Pat. No. 4,434,188 relates to the chemical vapor deposition of carbon atoms onto a stationary substrate in a chamber employing a hig energy plasma generated by the discharge of electrical energy across electrodes in the presence of a hydrocarbon and hydrogen. U.S. Pat. No. 4,504,519 employs radio frequency energy to effect the plasma decomposition of an alkane to form an amorphous carbonaceous film on a stationary substrate providing film thickness of 0.08 to 2.75 micrometers at voltages of $-50$ to $-2500$ volts discharged across carbon electrodes. U.S. Pat. No. 4,485,080 teaches the production of synthetic diamond powder in which an amorphous metal is heated and employed to precipitate diamond crystals from particles of such metal. U.S. Pat. No. 4,490,229 discloses a process in which carbon film is deposited onto a substrate by means of two argon beams, one containing hydrogen and the other carbon atoms.

SUMMARY OF THE INVENTION

This invention relates to an apparatus and method for applying hard coatings, such a films made of synthetic diamond, to the surfaces of various objects including small particles such as small and extra fine bits, short filaments and articles of manufacture by one or more techniques employing carbon atom containing molecules of vapor or gas mixed with hydrogen and subjected, along with the articles, to intense radiation such as microwave energy, while the articles are in constant motion such as in free fall, a fluidized state or tumbling or a combination of such motions.

In a preferred embodiment, particles of a core material are suspended in a fluidized bed formed of gas containing hydrocarbon molecules and hydrogen while microwave energy is beamed through the volume in which the particles are fluidized to cause carbon atoms to deposit on and eventually form a film of synthetic diamond completely surrounding the particles. In another embodiment, particles or small articles are conveyed by a rotating chamber to a high point therein from which they are dropped and allowed to fall freely by gravity through the center of the chamber while microwave energy is directed through carbon atom containing gas or vapor in the chamber and against the falling objects or particles causing carbon atoms to be stripped from their molecules and deposited on the objects as they fall until a film of desired thickness completely surrounds and bonds to the objects after they have been caused cycle and fall through the chamber a select number of times while vapor or gaseous deposition takes place.

In yet another form of the invention, small articles are caused to tumble within a reaction chamber, with or without falling through space, in a liquid and/or vaporous atmosphere in a reaction chamber while microwave energy is generated and directed at such tumbling articles and operates to cause carbon atoms to deposit and form substantially uniform coatings of synthetic diamond film on the articles.

Another embodiment of the invention involves the production of particles of synthetic diamond by depositing atoms of carbon onto substrate such as the flat surface of a rotating disc or the periphery of a drum on a continuous basis and either continuously or intermittently removing and forming flake or fine bits of the resulting synthetic diamond film by scraping, machining, brushing or otherwise removing same from the surface as it rotates.

Accordingly it is a primary object of this invention to provide a new and improved apparatus and method for for forming hard diamond-like or diamond coatings on articles of manufacture.

Another object is to provide an apparatus and method for forming particles of synthetic diamond for use as abrasive and/or high strength additives to composite structures made of ceramic and metal materials.

Another object is to provide an apparatus and method for forming filaments of synthetic diamond or coated therewith to impart high strength thereto.

Another object is to provide an apparatus and method for coating small articles, particles and the like with hard surface films, such as synthetic diamond, as they fall freely through space.

Another object is to provide an apparatus and method for coating small particles with synthetic diamond film by fluidizing same in a gaseous fluidizing medium containing hydrocarbon molecules and utilizing microwave energy passed through the fluidized bed to cause atoms of carbon from the molecules to deposit on the particles while they are in a fluidized state.

Another object is to provide an apparatus and method for coating hard, corrosion resistent synthetic diamond film and the like on small articles and objects such as articles of manufacture and particles as they tumble in a liquid containing carbon atoms, oxygen and nitrogen, while radiation, such as microwave energy, a plasma arc, electron beam, ion beam or beams are directed at such tumbling objects to case carbon atoms to deposit and form substantially uniform coatings on the objects over a period of time as they tumble.

Another object is to provide an apparatus and method for automatically forming composite articles of synthetic diamond coated onto substrates or cores of high strength material.

Another object is to provide a method for forming new and improved composite materials, such as metal and ceramic materials which are internally reinforced with synthetic diamond.

Another object is to provide an apparatus and method for forming improved surface coatings for articles made of synthetic diamond and a lubricating metal, such as chromium, deposited on and secured to the outer surface of the diamond coatings.

Another object is to provide an apparatus and method for forming extremely hard synthetic diamond films on articles by applying multiple coatings of organic liquid or liquids and subjecting each coating to radiant energy which is operable to effect the deposition of at least some of the ingredient in each coating to be deposited between each coating cycle.

Another object is to provide an apparatus and method for forming extremely hard synthetic diamond films on articles by stripping carbon atoms from both gaseous and liquid molecules in the vicinity of or disposed against the surface to be coated.

Another object is to provide an apparatus and method for forming extremely hard synthetic diamond films on articles by exposing the surfaces of such articles to a carbon atom containing gas or vapor and/or a organic carbon atom containing liquid and subject same to a combination of radiations of sufficient intensity to strip the carbon atoms from the molecules containing same.

With the above and such other objects in view as may hereafter more fully appear, the invention consists of the novel constructions of apparatus illustrated in the drawings and described in the specification as well as the methods set forth hereafter, but it is to be understood that changes, variations and modifications may be resorted to which fall within the scope of the invention as claimed without departing from the nature and spirit of the invention.

BRIEF DESCRIPTION OF THE DRAWINGS

FIG. 3 is a side view of an apparatus for coating small objects with synthetic diamond film and the like while they fall freely through space and/or are tumbled in a rotating chamber.

FIG. 4 is an end view of one form of the rotary chamber employed in the apparatus of FIG. 1.

FIG. 5 is a side view with parts broken away and sectioned for clarity of a modified form of the coating apparatus of FIGS. 3 and 4.

In FIG. 1 is shown an apparatus 10 for producing particles and filaments, preferably of composite materials and particularly useful in coating preformed particles with carbon in a hard diamond-like or synthetic diamond form. Apparatus 10 includes a vertically extending tank 11 having a cylindrical or otherwise shaped sidewall 12, a bottom wall 13 and a top wall 14. An inlet 16A is provided near the upper end of side wall 12 for admitting particles of material to be coated to the interior volume 11V of container 11. Such particles P are fed from a hopper 28 to the belt 26B of a belt conveyor 26 which is powered by a motor 27 having a speed controller 27C driving belt 26B to deliver particle C thereon to a screw conveyor 25 which controllably feeds such particles through the inlet or opening 16A in wall 11 by the controlled operation of its drive motor 25. Passing through the lower end 11C of tank 11 is a grill 19 formed of tubing containing upwardly extending holes 20 therein, through which holes a hydro-carbon vapor and/or gas, such as methane mixed with hydrogen, may upwardly flow as a plurality of jets or streams J thereof in a manner to fluidize the particles P admitted to the tank. An outlet 15, for such gas is located at the end of tank 11 to which outlet a pipe or duct 16 is connected for receiving and passing gas molecules from the tank to be exhausted therefrom or to be recirculated, after processing with replenishing gas, through the tubing of the grill 19 after removing unwanted constituents therefrom for properly mixing same with replenishing gas containing carbon atoms in molecules thereof.

Figure 1:
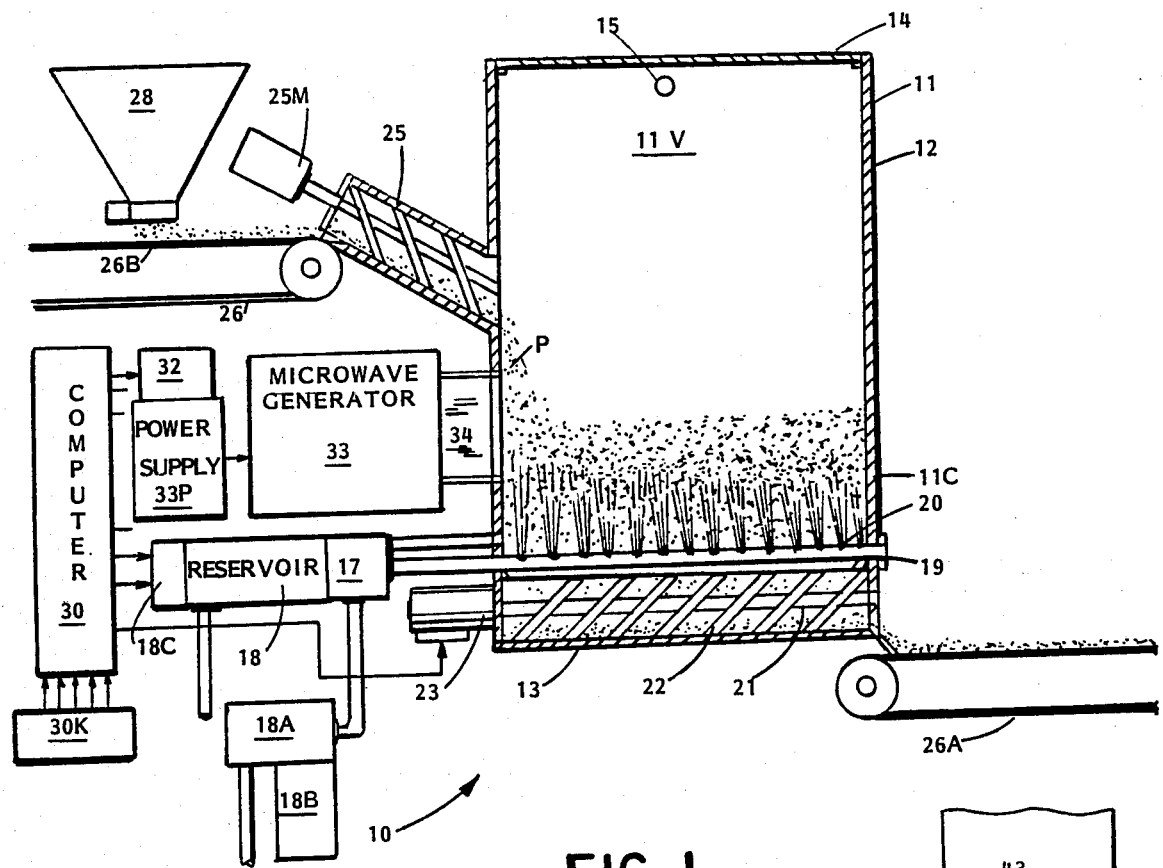
FIG. 1 is a side view with parts broken away and sectioned for clarity of a particle coating apparatus employing a fluidized bed and microwave energy to coat particles with very hard surfacing material, such as synthetic diamond film.

Connected to the tubing of the grill 19 is a compressor 17 and a reservoir or supply 18 of carbon containing gas and one or more additional reservoirs 18A, 18B of secondary gas, or gases such as hydrogen or means for making and controllably mixing hydrogen with the gas defined by carbon containing molecules. Such gases supplied to tank 11 may be pressurized therein to a pressure which is above atmospheric pressure. Such mixture to be processed is continuously forced through the tubing of grill 19 and out the holes 20 thereof. A controlled motor 17W operates compressor 17. A sensor or sensing system 17A is connected to compressor 17 for sensing the composition of the recirculating gas mixture and controlling same by controlling the operation of one or more motors or solenoids operable to control one more values and/or compressors for controlling the flow of the plurality of gases from reservoirs 18, 18A, etc. to tank 11 through the ducts or passageways extending from such reservoirs to inlets in the wall of the tank 11.

The carbon atoms containing gas mixture, which is controllably forced through the ducts of grill 19 and flows as a plurality of jets or streams vertically therefrom, may comprise a mixture of vapor of methanol, ethanol or acetone and/or methane and hydrogen and serves two purposes; (a) to fluidize particles or short filaments P flowed into the tank 11 through inlet 16A in a manner to suspend such particles as a layer thereof for an extended period of time while coating thereof with synthetic diamond progresses and (b) to provide a source of carbon atoms and, if utilized, auxiliary molecules such as hydrogen and/or molecules defined by an additional material or materials to be alloyed or mixed with the carbon atoms deposited on the particles or coated thereover. Thus extra hydrogen may be provided which minimizes graphite formation and improve the structure of the diamond film formed on particles of carbon atoms which are stripped from the gas molecules and deposited on the surfaces of the fluidized particles. To effect such action, a microwave generator 33 is supported adjacent the lower wall of the tank 11, as shown, or may be disposed within the tank and is operable, when energized, to generate and direct microwave energy through a wave guide 34 or a series of wave guides, into the interior of the tank 11, particularly through the lower portion thereof containing the fluidized bed of particle P. Such microwave energy heats and reacts on the gas molecules in a manner to remove or strip carbon atoms therefrom and also heats the particles P in the fluidized bed so as to cause the atoms of carbon stripped from the methane gas to deposit and bond against the surfaces of the particles to completely coat same with carbon in the form of synthetic diamond or diamond-like material.

While one microwave energy generator 33 is shown supported outside of tank 11 and is coupled through a duct 34 which may comprise a wave guide communicating with volume 11V, two or more of such generators may be disposed around the tank and may be operable to beam their microwave energy into the working fluidized bed volume 13V or may be mounted inside the tank, such as immediately above, beneath or to the side of said working volume.

A screw conveyor 21 is supported at the bottom of tank 11 for receiving and conveying coated particles out of and away from the tank when deposited into a receiving hopper for such conveyor at the bottom of the tank, an action which may be effected continuously or intermittently by varying the pressure of the gas ejected upwardly through the opening 20 in the grill 19 to either disrupt the operation of the fluidizing bed after the particles have been suitably coated whereas to cause the particles to fall downwardly to a screw conveyor or to cause particles to continuously fall into a hopper 21H leading to the screw conveyor 21. Screw 22 of screw conveyor 21 is driven by a motor 23 which may be continuously or intermittently operated depending on the manner in which the particles are removed from the fluidized bed. Particles are carried by screw conveyor 21 to a belt conveyor 35 which may extend to a further processing and/or packaging apparatus or to a storage bin therefor.

A computer 30 controlled by a keyboard 30K, is programmed to operate controls 32 for a power supply 33P for the microwave energy generator 33, controls (not shown) for the various conveyors valve and pump servos 18B, 18C, etc. for the particles and gases employed in the coating operation. Valves (not shown) controlled in their operation by signals generated by computer 30 may also be disposed on the inlets and outlets to the chamber 11 to permit gas pressure therein to be increased and maintained at a select working level or levels during one or more time intervals of the coating process.

The apparatus 10 of FIG. 1 may be modified in a number of ways to vary or enhance its operation in coating the particles P with films or thicker coatings of synthetic diamond. Such modifications are noted as follows:

1. The synthetic diamond process may be carried out under high gas pressure by providing suitable gates or valves at the inlets and outlets to the chamber 11 for the particles and carbon atom containing gas or vapor molecules and controlling the operation of such valves and gates in synchronization with the flow of such fluid(s) and particles by master controller or computer which also controls the application of microwave energy to the chamber volume 11V. Fluidizing gas may be recirculated to the fluidizing pipe or duct grid 19 within the chamber volume 11V by a suitable group or compressor operating therein and/or by controllably regulating its flow through one or mor exit valves to an external enrichment and recirculating system. Gates at the entrance to chamber 11 through which particles are delivered by conveyor 25 and the exit of conveyor 21, may be sealed closed during the time it takes to selectively coat a quantity of fluidized particles, during which interval a select number of charges of hydrocarbon and hydrogen molecule containing gas mixtures, with corresponding quantities of argon gas molecules, are admitted and pressurized followed by respective purgings of the remaining as products of reaction through an exit valve which is closed when the new or replenished charge of working gas is admitted to and pressurized within the working volume 11V. In such a system, conveyors 21,25,26 and 26A are synchronized in their operation and computer controlled to feed select quantities of uncoated particles to the volume 11V and the fluidizing medium and to remove coated particles therefrom while the microwave generator is controlled to heat the gas molecules and fluidized particles to effect the deposition and bonding of carbon atoms as synthetic diamond films on the fluidized particles.

If the core particles P fed to the reaction chamber 11 are made of a paramagnetic material, such as steel, they may be levitated or suspended in a magnetic field such as generated by an electromagnet or magnet made of superconducting components or formed of permanent magnets.

In another form of the coating apparatus 10, the coating chamber 11 may comprise a microwave energy wave guide inside of which fluidizing takes place with respect to a mixture of hydrogen and hydrocarbon molecules and particles suspending in upwardly flowing jets of such gas, while microwave energy is directed therethrough from a suitable generator coupled to one end of such wave guide.

To increase the rate of carbon deposition and the formation of synthetic diamond film on the particles, aerosoled particles or vapor formed of methanol, ethanol, acetone and/or other oxygen-nitrogen and carbon atom containing liquids may be controllably mixed with the fluidizing hydrocarbon-hydrogen-argon containing gas mixture or with other fluidizing gas, sprayed or otherwise delivered to the chamber volume 11V so as to intersect the particles and provide carbon atoms for forming synthetic diamond coatings thereon when subjected to suitable microwave energy as described.

After being coated with synthetic diamond to a select thickness, a lubricating material such as chromium or other suitable metal for use in bonding the coated particles together, may be applied by applying vapor(s) of such coating material to the volume 11V through one or more inlets or from one or more electrodes which are supported adjacent to or within the fluidizing bed and which are operable to form ane effect the deposition of such vaporous material(s) on the fluidized particles in a controlled manner, preferably under the control of the same computer (30) employed to control the other process variables during a coating cycle.

Auxiliary particle and fluid heating means, such as an induction coil or coils, one or more lasers or electron guns, or arc discharge electrodes or electrode arrays may be operable to generate and apply their radiant energy to the particles P in the fluidizing gas medium as well as the carbon atom containing gas.

Fluidizing may be effected while the interior volume 11V of the chamber 11 is pressurized to a suitable gas pressure defined at least in part by molecules of carbon atom containing gas and/or vapor and hydrogen gas which minimizes graphite formation in the synthetic diamond film so formed on the particles.

Figure 2:
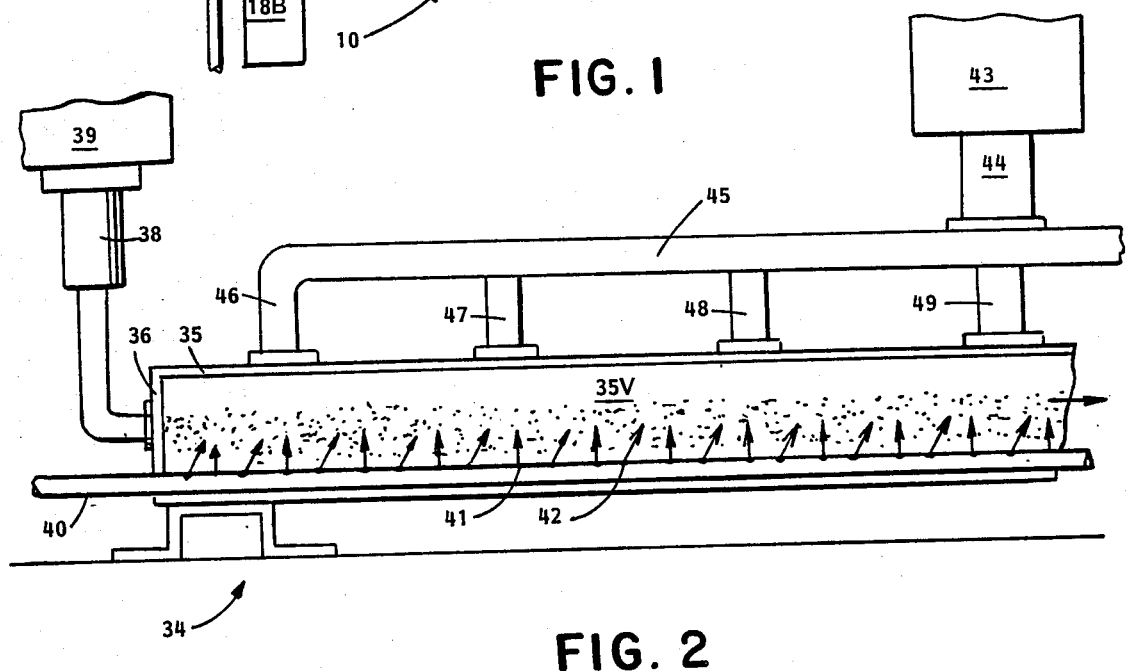
FIG. 2 is a side view of a modified form on the apparatus of FIG. 1.

In FIG. 2 is shown a modified form of particle coating apparatus 34 having an elongated coating chamber 35 formed of a tube or pipe, one end of which contains a closure 36 with a central opening to permit particles P of a material, as described, to be processed in the chamber 35, to form therin from an inlet duct 37 extending from a motor operated pump or blower 38 connected to a reservoir 39 of such particles mixed with a fluid, such as methane, hydrogen or a combination of same. The motor operating the pump or blower 38 may be automatically controlled, as in FIG. 1, by means of signals generated by a computer which also controls the flow of fluidizing gas, such as a mixture of methane and hydrogen, through a parallel array of tubes 40 extending along the lower portion of the wall of chamber or tube 35. The gas discharged to 40 is shown having a plurality of upwardly extending holes drilled along its length for exhausting streams of gas upwardly into the interior volume 35V of the chamber 35 in a manner to fluidize particles P, which are emitted through the inlet pipe 37, to generate either a standing fluidizing gas medium in the volume 35V for holding such particles suspended within the chamber 35 along its length and/or a fluidizing medium which moves along the chamber 35, from the left to the right thereof, depending on the direction and duration of flow of the fluidizing gas.

Shown in FIG. 2 are two arrays of small holes in the upper portion of the wall of the fluidizing gas inlet pipe 40, one array 41 having hole axes extending normal to the longitudinal axis of the pipe or tube 40 while the second array 42 of holes have their axes extending at an acute angle to the longitudinal axis of the pipe 40 in a downstream direction to the right. If a single passageway is provided in the gas inlet pipe 40, the flow of gas therefrom outwardly and in a downsteam directin, will induce the fluidized particles to flow in such direction. If the lateral holes 42 are connected to one inlet passageway within the pipe 40, gas may be flowed through such inlet passageway to effect a static fluidizing operation within the elongated chamber 35 in which a bed of particles P remains stationary for processing such particles by coating same with, for example, carbon in the form of a hard diamond-like material or synthetic diamond, when suitable microwave energy is applied to the gas and particles within the housing 35.

Also shown connected to the chamber 35 through spaced-apart openings in the side wall thereof, are a plurality of laterally extending conduits 46, 47, 48 and 49, each of which comprises a microwave guide extending to a respective source of microwave energy [not shown] or a branch microwave guide extending from a main guide 45 which is connected to a microwave energy guide 44 which receives the output of a single microwave energy generator 43. Branch microwave energy guides 46, 46, 48 and 49 are but four of a number of such guides extending from the main guide 45, each of which branch guides terminates at a respective opening in the wall of the elongated chamber or duct 35 and are operable to direct microwave energy through respective portions of the duct or chamber 35 for reacting on carbon containing gas molecules and particles P which are suspended and fluidized therein.

While a mixture of molecules of hydrogen and carbon atom containing gas, such as methane, is flowed through either or both arrays of openings 41 and 42 in the inlet duct or duct array 40 extending the length of the elongated chamber 35, for fluidizing particles P as a layer along the length of the duct, a controlled flow of such particles is caused to enter the upstream end of the chamber 35 to an opening in the end wall 36 thereof, conveyed through an inlet tube 37, either on a stream of gas when a fan or blower 38 connected to a reservoir 39 of such particles and suitable gas, operates. Here again, the operation of the microwave energy generator 43 or a plurality of such generators, the flow of fluidizing and reaction gas through the pipe or tubular grill 40 and the flow of particles and gas through the inlet pipe 37 are preferably controlled by means of signals generated by a master controller or computer as in FIG. 1, so as to predeterminately coat the particles with synthetic diamond material or other material in accordance with the composition of the fluidizing gas and secondary gas admitted through inlet pipe 37 with the particles P.

In addition to providing methane, hydrogen and argon gas through inlet pipe 40, methanol, ethanol, acetone and/or other carbon, hydrogen and oxygen containing liquid may be vaporized and fed through the inlet 37 along with the particles to be coated and or admitted through inlet duct 40. Such particles P may also be precoated with one or more of such carbon atom containing liquids, in the embodiments of FIGS. 1 and 2, prior to their admission to the respective chambers to assure a dense supply of carbon atoms on the surfaces of the particles for forming synthetic diamond film thereon in as short a time as possible. The coating or deposition process may be optimized by programming the computer to predeterminately control the flow of all materials to and from the reaction chamber(s) and the application and intensity of the microwave energy to the region of the fluidized particles or bed. One or more sensors sensing process variables such as gas pressure, microwave energy intensity and direction, fluidized bed density, density or flow of particles to and from the chamber and the pressures of the working fluid(s) may generate feedback signals for use the the computer 30 in effecting closed loop program and adaptive process control.

Also illustrated in FIG. 3 is a housing 77 supported by the side wall 52 of the chamber 51 and containing a microwave energy generator therein which communicates directly with the interior of the chamber to an opening [not shown] in the side wall thereof to provide suitable microwave energy for use in effecting the coating of articles or particles with synthetic diamond material derived from atoms of carbon stripped from the methane or carbon containing gas molecules flowed into the chamber through the rotary coupling 61 and hollow shaft 55. Notations 76 and 78 refer respectively to electrical cables supported by the side wall of chamber 51 and extending from the door opening actuator 75 and the input to the microwave energy generator in housing 77 to respective commutator assemblies 62 mounted on the shaft 55, which commutator assemblies connect to a line 81 extending from the power supply 79 providing electrical energy for powering the microwave energy generator in housing 77. A second input wire pair 81A connects a source [not show] of electrical energy passed through a switch 81S which is operatively closed during a cycle of operation when it is desired to operate the actuator 75 to open and close the chamber door 73.

As in FIG. 1 the apparatus 50 of FIG. 3 is computer controlled in its operation to effect and optimize the coating of synthetic diamond film on particles or small articles as they fall through the interior volume of the rotating chamber 51. The computer (not shown) thus controls the timing and intensity of microwave energy directed into the working volume 51A of the chamber 51 as it is power rotated, as well as other process variables such as the operation of respective pumps or compressors 63P and 65P for the process gases and/or vapors to be admitted through the rotary coupling 61 to the chamber, the starting and stopping of motors 60 and 71 for rotating and tilting the chamber and the motors and actuators for driving the In FIGS. 3 and 4 are shown details of a modified form of the invention comprising an apparatus 50 which may be utilized to coat particles of metal, ceramic, synthetic diamond, graphite or other suitable materials including small articles, with a synthetic diamond material of the type described and derived from carbon atoms which are stripped from molecules of a carbon containing gas by means of microwave energy. The apparatus 50 employs a rotatable reaction chamber 51 of somewhat spherical shape and supported for rotation about an axis of symmetry by means of a hollow shaft 59 connected to the output shaft of a controllable electric motor 60. Motor 60 is secured to an upwardly extending arm 72 which is pivotally supported by pillow blocks 71 supported by a base 70 wherein the mount 72 may be rotated by means of a gear motor 71M secured to the base 70. Thus the chamber 51 may be rotated about a horizontal axis or an axis which is varied in its attitude with respect to the horizontal during its rotation to permit solid particulate or article contents of the chamber 51 to be tumbled therein and caused to fall through the free space internal volume thereof.

The side wall 52 of the chamber 51 is provided with a plurality of inwardly extending shelves or flights 54, as illustrated in FIG. 4, which are attached to the inside surface of the side wall 52 of the chamber and serve to carry articles or particles disposed within the chamber to a location near the top of the chamber as the chamber rotates, from which shelves the particles or articles slide off and fall through the central volume 51V of the chamber to permit the entire surfaces of the articles to be exposed to the fluid or gas molecules disposed in the chamber and microwave energy generated within or beamed into the chamber during the coating process which may involve hundreds or thousands of rotations of the chamber resulting in the tumbling and free fall of each of the particles or articles during each complete rotation thereof.

A circular opening or aperture 51A is provided at the free end of the chamber which has a circumscribing circular flat rim 53 against which a disc shaped closure or door 73 is caused to sealingly engage when an actuator 75, which is secured to the side wall of the chamber near the rim 53 and is operable, when activated, to operate a mechanism 74 for pivotting the door 73 against and away from the surface of the rim 53.

Loading of the chamber with particles or articles to be coated therein is provided by means of an input conveyor 84, the belt 84B of which is controllably loaded with articles or particles which are carried to the end thereof and discharged onto a gravity chute 85 which is pivotted and projected by means of a motor or lineal actuator 86 to dispose the end of such chute within the confines of the chamber 51 after the door 73 has been pivotted open and out of the way of the retracted chute. At the end of a coating operation, the chamber 51 is disposed so that the free end of the door 73 is in a downward direction permitting the chamber to be emptied of its contents when the actuator 75 opens the door and the chamber is downwardly directed to cause the contents of the chamber to flow onto a receiving chute 87 supported adjacent a discharge belt conveyor 86 when the latter chute is properly projected and located by means of a motor or lineal actuator 88 supported by a support for the discharged conveyor.

The chamber 51 is supported for rotation about the longitudinal axis of the shaft of constant speed gear motor 60, which shaft is axially aligned with a tubular shaft 55 containing at least two passageways 56 and 57 which communicate with the interior volume 51V of the chamber 51. Passageways 56,57 may each contain a separately controllable valve (not shown) which may be programmed or computer controlled to admit respective working fluids during each coating cycle to the chamber or to admit select amounts of working fluid and exhaust the gaseous remains of each coating cycle reaction. The each of tubular support and shaft 55 is secured by means of a collar fitting 58 which is welded to the closed end of the chamber. Secured to shaft 55 is a rotary coupling 61 which is connected to at least two inlet conduits 64 and 66 extending respectively from motor operated pumps 63P and 65P which controllably force one or more fluids, such as methane and hydrogen gas or other coating material through the coupling 61 and the respective passageways 56 and 57 of the hollow shaft 55 into the chamber 51. Recirculation of such gas or gases or their exhaustion to the atmosphere, may be effected through one or more additional passageways of the hollow shaft 55 and a passageway or passageways of the rotary coupling 61 connected to a suitable exhaust or recirculating system to permit the working gas or gases to be constantly replenished from the reservoirs 63 and 65 and recirculated for reprocessing or exhaustion to the atmosphere.

Microwave energy for operating on the carbon containing gas molecules and the particles or articles disposed in chamber 51, is generated by a microwave generator 80 mounted adjacent the chamber and energized by electrical energy provided by an attendant power supply 79 of conventional design. The output of microwave energy generator 80 is passed through a wave guide 82 having its open end disposed close to the outer surface of the central portion of the side wall 52 of chamber 51 to permit such microwave energy to be directed therethrough and the wall of 52 as the chamber rotates. The wave guide 82 may be operable to be power driven close to the surface of the side wall 51 during operational rotation thereof and retracted therefrom when the chamber is pivotted for loading and unloading operations. As in the system 10, a computer may be employed to control conveyors 84 and 87, opening and seal-closing the gate or door 73 and the operation of valves (not shown) for retaining gas under suitable pressure within the chamber volume 51A during coating.

Other modes of operation of the apparatus of FIGS. 3 and 4 are noted; one in which a predetermined quantity of a gas and/or vapor containing hydrogen and carbon atoms and, if used, and oxygen-nitrogen-carbon containing organic liquid is charged into the chamber 51 after the gate 73 is sealed closed and a after select quantity of objects, particles or articles have been admitted to the chamber followed by controlled powered rotation of the chamber while microwave energy is generated and beamed through the central portion of the volume 51A to intersect the articles as they fall freely through space to effect the described formation of carbon film in the form of synthetic diamond on the articles. In a second mode of operation, such gas mixture is flowed continuously through the chamber volume 51A while microwave energy is passed therethrough and the chamber rotates to cause the articles to fall through the center of the volume 51A. In yet another modified form of the invention, the vanes 54 may be modified in shape or eliminated to permit the articles to be coated to continuously tumble as the chamber is rotated to expose same to the gas and/or oxygen-nitrogen-carbon containing liquid disposed to a select depth at the bottom of the chamber and/or to vapor of such liquid. The apparatus may also be operable to both tumble and cause the free fall of articles through the chamber for coating by by one or more of the described processes employing gas, vapor or liquid coating media.

In FIG. 5 is shown a modified form of the coating apparatus of FIG. 3 employing a rotatable chamber 90 and a wave guide 100 for microwave energy, which wave guide protrudes into the interior of the chamber and is sealed with an opening in a disc shaped door 91D which remains fixed while the chamber rotates. A dynamic seal 92S between the rim 92R of the chamber wall 91 and door 91D maintains gas pressure in the chamber interior volume 90V while the chamber is power rotated.

The chamber 90 is supported for rotation and pivotal movement on an upstanding support 97 supported by a base 98 extending beneath and beyond the chamber. The support 97 supports a constant speed gear motor 89, the output shaft of which is connected to rotate chamber 90 about its longitudinal axis. A second gear motor 96 is supported at the upper end of support 97 and operates to pivot the chamber about a horizontal axis extending lateral to the rotational axis of the chamber. The chamber 91 may thus be rotated about its longitudinal axis by the controlled rotation of the motor 89 and pivotted, both during its rotation and while stationary, to permit the unloading of the chamber by gravity when it is pivotted downwardly.

The disc shaped closure or door 91D is supported for longitudinal movement with the movement of the wave guide 100 for microwave energy generated by a microwave energy generator supported within a housing 99 which the wave guide slidably engages and moves longitudinally therealong. The wave guide housing 100 and the closure or door 91D to which the wave guide is attached across an opening therein, form an assembly which is actuated to move longitudinally with respect to housing 99 by means of a lineal actuator 101 secured to the wall of the housing and engaging a bracket 100B secured to the outside surface of the wall of the wave guide. The peripheral rim of the disc shaped door supports a rotary seal with the rim 91R surrounding the opening in the chamber housing 90 so that the interior volume thereof may be sealed from the atmosphere during the coating operation. Microwave energy generated by the generator within housing 99 is passed through the wave guide 100 and beyond the open end thereof into and through the interior volume 90V of the chamber to permit it to react on gas molecules and particles or articles disposed in the chamber as the latter tumble and fall through the center of the chamber when the shelves or flights 93 which protrude into the chamber from the side wall thereof carry such articles and particles upwardly to a discharge location near the high point in the rotation of the chamber.

Supported above the housing 99 is an assembly composed of two motor operated pumps 104 and 107 which respectively receive particles P and one or more gases to be admitted to the interior volume 90V of the chamber 90 through respective inlet ducts 105 and 108 extending from the pumps 104 and 107.

Located below the chamber for receiving particles or articles which have been coated or otherwise treated during the operation of apparatus 88, is a discharge chute 109 with its attendant pivotting actuator or motor 110 which pivotally drives the chute into operative alignment with the lower end of the chamber 90 when it is downwardly disposed by the operation of the pivotting gear motor 96. The discharge chute 109 receives material from the chamber 90 and flows same onto the upper surface of the belt of a belt conveyor 112 carrying same away from the coating apparatus to storage.

In a modified form of the apparatus 50 of FIGS. 3 and 4 and 88 of FIG. 5, it is noted that one or more microwave generators may be mounted directly within the respective chambers 51 and 90, supported by the wall thereof or by a stationary shaft extending through the center of the drive shaft for the motor rotating the chamber. Such microwave energy generator may be operable to generate and direct microwave energy diagonally through the reaction chamber along the axis of rotation thereof to cause such energy to intersect particles or articles falling through the chamber as it rotates. A wave guide or plurality of wave guides extending from such internally mounted microwave energy generator may also be operable to direct the microwave energy generated in a plurality of directions, such as radially with respect to the axis of rotation of the chamber for simultaneously intersecting particles or articles as they fall through the center of the chamber and as they are carried upwardly therethrough.

In yet another form of the embodiments illustrated in FIGS. 3 and 5, particles introduced into chambers 51 and 90 may also be fluidized therein by means of fluidizing gas ejected upwardly from a plurality of openings in one or more tubes or pipes held stationary in the chamber and extending parallel to the axis of rotation therein.

Notation 102 refers to a support for the housing 99 and the work supply reservoirs 103 and 106 supported thereabove. It is also noted that the support 98 and the assemblies which it supports, may be pivotally mounted on bearings or pillow blocks 111 to permit the chamber 90 to be pivotted while it rotates without misaligning its rim 92R with respect to the door 91D. Such latter pivotal movement of the entire assembly including the base 98 may be effected by means of a suitable gear motor or lineal actuator supported by the floow or another frame.

The apparatus of FIG. 5 may also be operated in the modes described above for the operation of the apparatus of FIGS. 3 and 4 wherein particles or articles are coated with synthetic diamond film by tumbling same near the bottom of the chamber effected by rotating the chamber using shorter vanes 90V to effect tumbling movement or by a combination of tumbling and free fall through the chamber. Coating may so be effected by means of gas and/or vapor of the type described and/or organic liquid as described which is disposed in the bottom of the chamber and admitted through a valve and pump in a duct extending through the microwave guide 100 and terminating at the end thereof. Gas and/or vapor flow may be continuously effected at suitable high pressure or provided intermittently as separate charges thereof admitted to the chamber after purging the chamber of the previous charge though suitable exhaust valve(s) located in a return flow line (not shown).

The cyclic or continuous coating operations described with respect to apparatus 88 of FIG. 5 may be computer controlled wherein a plurality of sensors sensing process variables such as gas flow, gas pressure, temperature in the chamber and driving movements may be employed to optimize the coating operation. by providing suitable feedback signals to the computer.

Figure 6:
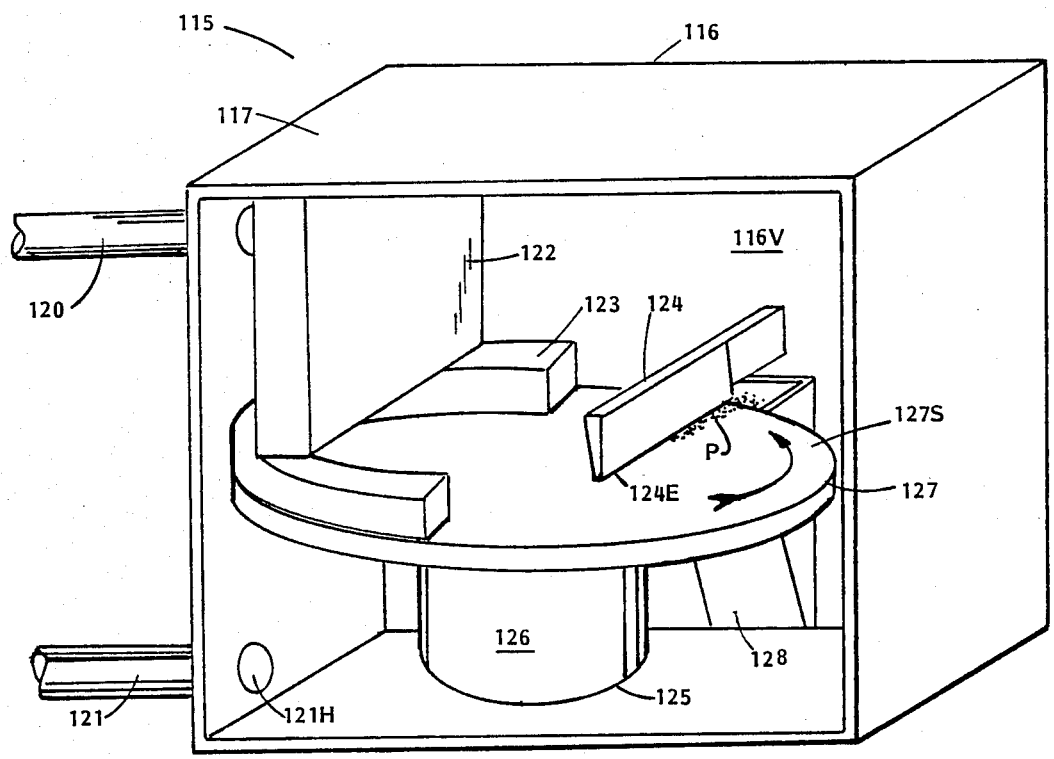
FIG. 6 is an isometric view with parts removed of an apparatus for forming diamond particles used in one form of operation of the apparatus of FIGS. 1 to 5.

In FIG. 6 is shown details of an apparatus 115 which is operable to produce diamond particles and the like from coatings of synthetic diamond material deposited onto a rotating disc and scraped or machined therefrom as the disc rotates. Apparatus 115 comprising a reaction chamber assembly 116 having a closed housing 117 containing a turntable assembly 125 including a cylindrically shaped support 126 containing a constant speed gearmotor (not shown) with an output shaft connected to and supporting a large turntable 127 in the form of a large steel disc having a smooth, flat upper surface 127S, which is caused to rotate about a verticle axis at substantially constant speed while synthetic diamond is deposited on such upper surface as a result of the heat and reaction of microwave energy on the disc and a carbon atom containing gas, such as methane, which is continuously admitted through an inlet duct 120 to the internal volume 116V of the chamber housing 117. Such microwave energy is generated by one or more microwave energy generators located in a housing 122 supported within volume 116V which either direct their microwave energy directly against a portion of the upper surface 127S of the large disc 117 or through a wave guide 123 shown coupled to the housing 122 for receiving and guiding microwave energy from the generator or generators in housing 122 and guiding such microwave energy against an extended annular area of the disc 127.

While a mixture of methane and hydrogen gas employed in the reaction involving the chemical vapor deposition of carbon on the surface 127S of disc 127 may be circulated through the volume 116V by means of suitable motorized compressors or fans (not shown) operable to receive such gas from inlet duct 120 and pass gas to exhaust duct 121 after giving up carbon atoms, such mixture may also be flowed directly from inlet 120 to the microwave energy wave guide 123 which partly circumscribes the upper surface 127S of the turntable 127 close to the upper surface as shown. The gas mixture may be flowed from one or more openings in the wave guide 123 to pass with the microwave energy therefrom to the surface of the disc or turntable whereupon carbon atoms are stripped from the molecules containing same and deposited as a coating or film on such surface.

While microwave energy wave guide 123 is shown as semicircular in configuration, it may be replaced by an otherwise shaped wave guide or a series of wave guides axially directed downwardly from one or more microwave energy generators in housing 122 and terminating with their open end(s) close to the upper surface 127S of the turntable 127.

Shown supported by a wall of the housing 117 is a blade or bar 124 having a tapered lower edge 124E which is operable to be spring loaded or motor driven against the uppoer surface of the turntable disc 127 and the synthetic diamond coating deposited thereon to scrape or machine remove same therefrom. The flakes or particles of synthetic diamond are collected in a bin 128 defined by a chute or hopper located at the side of the truntable as shown. The particles or flakes of synthetic diamond flow along the blade or cutting tool 124 as the turntable slowly rotates and fall off the edge of the turntable into the bin 128. They may flow or be conveyed therefrom to a grinding mill (not shown) which comminutes same into particles of a desired fineness or mean size or. Such particles or small flakes may also be conveyed to the described coating apparatus on a continuous or intermittent basis, or may be coated and grown to larger diameter particles in chamber 117 by for example, generating a fluidized bed of such particles and carbon atom containing gas flowed through the turntable and ejected from small openings therein in an upwardly direction or through a pipe or pipes located beyond the periphery of the turntable.

The operations described above and hereafter, preferably employ mixtures of a gas formed of carbon atom containing molecules and hydorgen wherein the microwave energy generated and directed through such gas is operable to heat the substrate and gas molecules adjacent thereto, to a temperature in the range of 1000° to 2000° C. For the upper temperature range, the turntable 127 may be made of heat corrosion resistent alloys such as Inconnel X or high temperature ceramic material used per se, reinforced or coated on the upper surface 127S.

In a modified form of the apparatus 115 of FIG. 6, the blade 124 may be oscillated with mechanical vibrations applied thereto or by means of ultrasonic energy applied thereto with one or more ultrasonic transducers to facilitate the removal of synthetic diamond as particles or flakes from such upper surface. One or more motor driven wire brushes may also be rotated against the diamond coating to break it up and remove it as flakes or particles from such surface. An intense laser beam or beams may also be directed against such synthetic diamond coating to scribe same to facilitate its removal by mechanical means as described or to remove same per se by shock wave generated therein. High velocity water jets may also be applied to break up and remove the diamond coating from the surface on which it is formed.

The processes described may be effected while the turntable is rotating at a constant speed or driven intermittently to allow a length of the annular portion of the turntable which is scanned, to receive carbon atoms and allow same to form to a select depth of coating before exposing a new length of the turn tables annular surface to microwave energy. Removal of the diamond film as flakes and/or particles thereof may be effected on a continuous basis or by applying the wire brush or blade to scrape or machine away the coating after a select number of rotations of the turntable or drum and a select thickness of coating material has deposited therein, a function which may be controlled by timing or counting rotations or by sensing coating thickness and generating feedback signals for use by the computer in properly controling the coating apparatus. While the powered wire brush, scraping or cutting tool may operate to sweep or flow the particles or flakes into the receiving end of the hopper, suction applied to a nozzle or positive gas pressure in the form of a stream or streams may be directed across the surface of the disc 127 to cause continuous or intermittent flow of such particulate material into the hopper. Disc 127 may be replaced by other power driven endless surface devices such as a drum or endless metal belt onto which carbon atoms are deposited to form diamond layers which are removed as described, and cominuted to form particles thereof.

Figure 7:
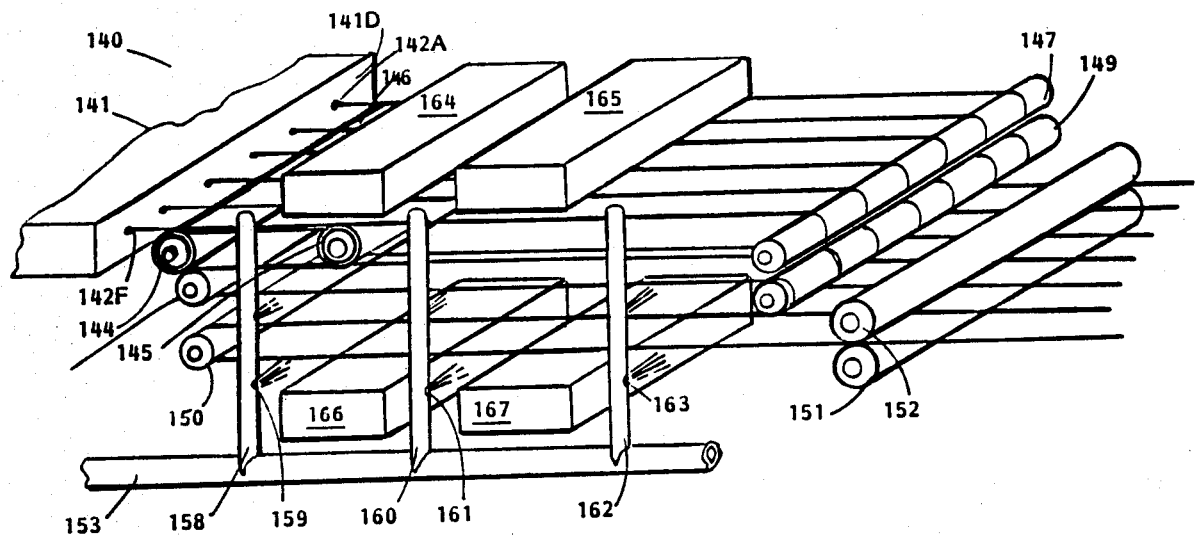
FIG. 7 is an isometric view with parts broken away for clarity of an apparatus for forming a coating filaments with a hard protective and reinforcing material such as synthetic diamond.

In FIG. 7 is shown an apparatus 40 for continuously producing filaments of material which is coated with a synthetic diamond material. The apparatus 140 includes an extruder 141 having an extrusion die 141D containing a plurality of die openings 142A to 142F, through each of which openings is extruded a respective filament or otherwise shaped extrusion formed of suitable metal, ceramic or plastic forced through such die openings by conventional extrusion means. In a preferred form, the material employed to form the filaments 143 comprises either high strength graphite or a resin which may be converted to graphite by pyrolizing same by means of intense radiant energy.

A belt conveyor 144 is shown having rollers 145A and 145B and an endless belt 146 against the upper surface of which the filaments 142 are disposed immediately after they exit from the die openings 142. Thereafter the filaments are carried in parallel back and forth around a plurality of elongated parallel rollers 147, 148, 149, 150, etc. permitting the filaments to be closely spaced to each other to receive both radiant and microwave energy for processing and coating same.

Typical radiant energy generators are provided in a plurality of housings 164, 165, etc. supported above and close to the parallel array of filaments. The radiant energy thereof serves to pyrolize the resinous material extruded to the filamentary shapes, to form a high strength graphite material thereof.

As the filaments are driven back and forth through the housing containing the apparatus 140, a carbon atom containing gas, such as methane, is forced through an inlet header 153 to which header are connected a plurality of parallel, closed ended tubes 158, 160, 162, etc., each of which has a respective number of openings 159, 161, 162, etc. Extending along its length for admitting a mixture of carbon atom containing gas molecules and hydrogen to the volume immediately surrounding the filaments as they are driven. Microwave energy is generated by respective generators in a plurality of housings 166, 167, etc. extending beneath and across the array of filaments and are directed upwardly against such filaments and the gas molecules surrounding same to heat the filaments and cause carbon atoms of such molecules to be stripped therefrom and to deposit onto the filaments as they are slowly driven back and forth through the housing. It is noted that microwave energy may be utilized per se to pyrolize the resinous filaments after they are formed to shape and to cause carbon atoms to deposit as a thin film or coating against the outer surfaces of the filaments from molecules containing such carbon atoms in the gas surrounding the filaments. The filaments may also be fed from spools thereof.

The parallel array of coated filaments are driven from the apparatus illustrated by a pair of powered rollers 151 and 152 from which they are drawn onto respective spools [not shown] for winding and storage thereof.

Figure 8:
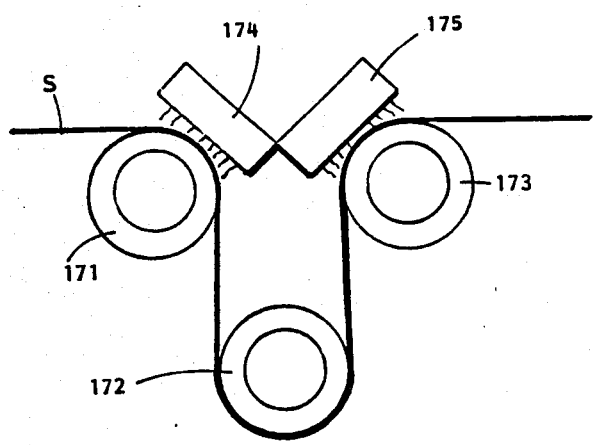
FIG. 8 is a partial side view of a modified form of the apparatus of FIG. 7, for producing diamond filaments useful in the formation of composite particles and filaments by means of the apparatus of FIGS. 1 to 5.

In FIG. 8 is shown part of an apparatus 170 for coating a sheet of suitable plastic or metal with synthetic diamond material. The sheet S, or a plurality of parallel filaments, is drawn around a first power rotated drum 171, then half way around a second powered drum 172 and thereafter approximately a quarter of the way around a third powered drum 173. Disposed immediately drum 171 and drum 173 are respective microwave energy generators 174 and 175 or wave guides extending from a single microwave energy generator, which are operable to direct microwave energy against the sheet or filaments S aligned with the respective drums 171 and 173 for treating and coating same with synthetic diamond material, as described.

The apparatus of FIGS. 7 and 8 may be modified in a number of ways, viz:

1. The parallel array of filaments 143 to be coated with diamond produced synthetically thereon by gas or vapor deposition of carbon atoms in the presence of hydrogen to minimize graphite formation, may be supplied from respective coils or spools thereof wherein certain or all of the rolls 147,149,150,151, and 152 may be motor driven to drive the filaments wound thereon and fed therebetween at a controlled speed past the microwave energy generators 164–167. If the filaments 143 are made of ductile metal such as aluminum, steel, titanium, nickle or other roll formable material, they may be continuously die or roll formed to shape and delivered parallel to each other past the microwave generators.

2. The apparatus 140 of FIG. 7 is preferably disposed in an enclosure or reaction chamber in which the coating vapor or gas may be contained and pressurized to increase the rate of carbon deposition, while flow of carbon atom containing molecules is controlled to occur continuously or intermittently into the chamber while the gaseous products of reaction are similarly removed from the chamber.

3. An organic liquid containing nitrogen, oxygen and carbon may be employed per se or together with the hydrocarbon -hydrogen gas mixture to effect rapid coating of carbon atoms on the filaments 143. Such liquid(s) may be applied by one or more means to the filaments 143 as they are fed, such as by spraying, roller coating or passing the filaments through one or more tanks of such liquid during processing. One or more liquids such as methanol, ethanol, acetone may be so employed per se or in combination with a gas, such as methane mixed with hydrogen molecules, and disposed in the reaction chamber containing tge filaments to cooperate in depositing carbon atoms as a single or multiple layer film of synthetic diamond on the filaments while they are held stationary or slowly moved through the chamber as described through one or more microwave energy fields. Diamond film formation may thus be effected as a result of carbon atoms separated from methane gas molecules while the filaments are at one or more locations in the chamber and from molecules of a liquid hydrocarbon which is coated on the filaments after they emerge from an open container of such liquid or a combination of carbon atoms from the gas mixture and the liquid existing at the same filament location. If the liquid is employed per se, it may be supplied from either one or more open containers of the liquid into which the filaments are driven in their guided travel through the chamber and coated on the filaments when they emerge from the liquid container wherein carbon from such liquid coating is deposited on the surfaces of the filaments when subjected to microwave energy. The chamber atomsphere during such coating may comprise hydrogen gas under sufficient pressure and/or flow to minimize the formation of graphite in the synthetic diamon coating deposited on the filaments. Similarly, if the filaments or other objects are coated in the chambers of FIGS. 1 to 6 by wetting and coating same with methanol, ethanol, acetone or other carbon, oxygen or nitrogen containing organic liquids, hydrogen gas may be employed under sufficient pressure and flow the minimize graphite formation in the synthetic diamond coatings deposited in the articles as they are fluidized, fall through space and/or tumble as described. Particles or droplets of such liquids may also be formed by vaporization in the chamber using hydrogen or a mixture of hydrogen and methane to atomize same through suitable nozzles located to deliver same to the filaments as they are driven through the chamber, wherein the droplets which do not deposit on the filaments fall to one or more collection tanks at the bottom on the chamber and the resulting liquid is recycled.

Further modifications to the apparatus described are noted as follows, which form part of the instant invention:

1. The particle coating apparatus 10 of FIG. 1 and 34 of FIG. 2 may be operated with a vapor of methanol, ethanol, acetone or other carbon-oxygen and/or nitrogen containing organic compound or a mixture thereof which replaces or supplements the methane-hydrogen-argon gas mixture described. Such organic liquid or liquids may be vaporized with heat and/or controllably sprayed from a nozzle or nozzles into the fluidized bed of particles to be coated and/or delivered to the fluidized bed on a hydrogen or methane-hydrogen gas stream flowed through the inlet ducts 19 and 40 and ejected as a plurality of fluid jets from the openings 20 and 41 therein.

2. In the apparatus of FIGS. 3 to 5, such organic liquid containing carbon, oxygen and hydrogen and/or nitrogen atoms as set forth above may be provided per se or in combination with a methane-hydrogen gas, in either of two forms to coat the objects or particles disposed in the rotating treaction chambers 51 and 90. The carbon atom containing liquid may be vaporized with heat and/or atomized and fed continuously or intermittently as a spray and/or on a carrying gas or gas mixture, as described, into the chamber to be intersected by the articles or particles as they fall through the chamber and as microwave energy is directed therethrough as described to provide a more rapid means for depositing carbon as diamond film on such articles.

3. In the apparatus of FIGS. 3 and 5, a hydrid method of coating small articles with carbon in the form of synthetic diamond may comprise the use of such an organic liquid to a select depth at the bottom of the chamber through which the articles or particles are carried as the chamber rotates, vapor of such liquid and/or a spray thereof from a nozzle or nozzles supported within the chamber to provide liquid droplets on the articles as they fall and/or a hydrocarbon-hydrogen gas mixture, wherein such fluids are continuously mixed and introduced into the chamber or are intermittently flowed into the chamber and sequentially or simultaneously purged therefrom after use, as described.

4. The apparatus 115 of FIG. 6 may also be modified to provide one or more nozzles directly above the upper surface 127S of the disc or turntable 127, which operate to continuously or intermittently spray methanol, ethanol, acetone or other carbon-oxygen and/or nitrogen containing organic or inorganic liquid on that portion of the surface about to be subjected to the microwave energy. Many layers of diamond film may be formed one on the other as the table 127 rotates and presents surface 127S many times to the microwave energy and the fine spray of such liquid in the chamber under suitable gas pressure provided by hydrogen, hydrogen-argon, methane-hydrogen, methane-hydrogen-argon gas mixture, or other suitable gas or mixture which serves to minimize graphite formation in the coating and, when employed, to carry vapor or droplets of such organic liquid to the surface 127S.

5. Auxilliary forms of radiation, other than microwave radiation, may be employed per se or in combination with microwave radiation to improve the coating and/or increase the rate at which carbon atoms form diamond film on the surface or surfaces described. Such auxilliary radiation may be in the form of one or more beams of monochromatic light generated by a laser or lasers, one or more ion beams containing particles to be implanted into the diamond film coating the surface(s), one or more electron beams or other form of high energy radiation, or combinations thereof which are controllably generated and directed.

6. Radiation in the form of an arc or arcs, such as formed between a pair or pairs of electrodes, a plasma torch or a combination thereof, may be applied directly to the fluidized beds of the apparatus of FIGS. 1 and 2, to the reaction volumes 51A and 90 V of the apparatus of FIGS. 3 and 5, the volume 116V of FIG. 6 or the interior of the reaction chamber in which the coating apparatus of FIGS. 7 and 8 is operable, to improve the quality of the coating material and/or reduce the time required to effect a select coating thickness.

7. In a modified form of the apparatus of FIGS. 3 to 5, the rotating chambers thereof may be replaced by an endless conveyor of a gas flow system operable to continuously carry particles or articles in a closed loop path extending vertically in a reaction chamber to allow same to fall freely through a select region or zone thereof and to intersect during their falling travel gas molecules and/or vapor particles of carbon atom containing material to the type or types described above, while microwave energy is beamed against the articles during their free fall to deposit a film of synthetic diamonds thereon.

8. Synthetic diamond films may also be deposited onto a substrate by means of radiant energy generated by a plasma jet or arc into which arc or jet is injected one or more fluids containing a hydrocarbon, such as methane gas and/or one or more liquids such as methanol, ethanol, acetone, etc. Suc hydrocarbon fluid may be flowed axially through the plasma arc or jet or at an angle thereto to cause carbon atoms thereof to deposit onto the surface against which the arc or jet is directed. Microwave energy may also be directed against the surface onto which the plasma particles and radiation are directed to provide additional radiation for depositing and forming the synthetic diamond coating thereon.

9. In a modified form of the apparatus of FIG. 5, the microwave energy generator in the housing 99 and the waveguide 100 may be employed to coat surfaces and articles with synthetic diamond film without use of the rotary chamber 91 coupled thereto as described. For example, the from rim surrounding the front opening in the waveguide 100 may contain a sealing ring circumscribing same permitting it to be abutted against and sealed to a surface of an article or assembly to be coated with a fluid directed therethrough and microwave energy passed through such fluid to the surface of the work as described. The wall of the waveguide 100 may be coupled to the front end of the housing 99 by means of a metal bellows welded to the open ends of the waveguide and the rim of the opening in the housing 99 permitting the waveguide to be advanced and retracted with respect to housing 99 and a surface to be coated aligned with the sealing rim of the waveguide. If the waveguide 100 and the housing 99 for the microwave energy generator are secured fixed and sealed together, such assembly may be power driven or hand held against the work to be coated.

An article or articles to be coated as described with synthetic diamond and/or other material admitted through the wave guide to the surface of the articles, may also be disposed within the waveguide on a mount which may be fixed or movable such as in rotation within the waveguide.

If the open ended waveguide 100 is disposed within a reaction chamber having a controlled atmosphere containing carbon containing molecules, its open end may be directed by motorized manipulation of the waveguide within such chamber to intersect and scan different portions of an article or articles in the chamber. A manipulator for an article in such chamber may also be employed to locate different and select portions of the surface or surfaces of an article in operative relation with the end of the waveguide for coating using radiation as described.

Articles which may fabricated using the apparatus of FIGS. 3 to 5 and particles produced in the apparatus of FIGS. 1 and 2 are noted as follows and form part of the instant invention:

1. Bearings and bearing components may be partly or completely coated with a thin film of synthetic diamond, particularly on the surface portion or portions thereof subject to wear and attrition. The outer surface of the diamond film or the portion or portions thereof subject to frictional wear during use by engagement with a mating surface or bearing component such as a shaft, ball, roller or race or the cylindrical surface of the bearing, may be coated with a lubricating material such as chromium, chromium alloy or other metal, deposited thereon by electro or electroless plating, sputtering or vapor deposition. Such plating operation may be effected while the bearing or bearing component is disposed within and caused to free fall and/or tumble in the chambers 52 and 91 of the apparatus of FIGS. 3 and 5 by the controlled addition of suitable plating solution, vapor or gas to the chamber preferably after the procedure described in which the bearings or bearing components in the chamber have been coated with synthetic diamond. If such plating is effected by electroless plating, replacing the carbon atom containing fluid in the chamber with electroless plating solution flowed through the respective inlet ducts may suffice to provide chromium or other suitable protective coating material over the synthetic diamond coating. Admission and removal of a select quantity of such plating solutions may be effected automatically in a computer controlled cycle which includes automatic control of the described functions requisite to apply the hard diamond coating to the article prior to the lubricating or wear resistant coating. If electroplating is employed in a modified form of the chamber 52 with the vanes 54 removed or made smaller, one or more electrodes may be supported by the chamber wall and operable to rotate therewith while electrically energized or may be directed downwardly into the plating solution from a stationary tubular support extending through the center of the tubular shaft 55 into the volume 51A.

If the apparatus of FIG. 5 is modified to permit the electroplating or sputtering of films or coatings onto articles disposed in the chamber 91 as it rotates, electroplating electrodes or sputtering electrodes may be supported by the stationary housing 100 and operatively extend therefrom into the chamber volume 90V into the plating solution or close to the articles to receive sputtering radiation and particles. During either the electroplating or electroless plating operation, microwave energy may be generated by one or more of the microwave generators described and directed at the tumbling or falling articles and plating solution to heat same so as to effect or increase the rate of deposition of the plating material by causing and/or accelerating the chemical plating reaction. Such radiant energy may also be employed to improve the bond between the synthetic diamond coating and the lubricating metal film and to improve the quality of the surface of such film or coating.

For those articles or components which require hard synthetic diamond and/or protective lubricating coatings only on select areas of their surfaces, selective area deposition and plating may be effected by (a) assembly of the articles with objects which are shaped to cover a portion or portions of the articles to prevent deposition thereon, (b) removal of deposited material from the select surface area or areas required to be void of coating material by brushing, machining, radiation beam or chemical etching or (c) by post machining the article to a new shape wherein both a portion or portions of both the substrate and the coating are selectively removed. Such removal of coating material or the prevention of its deposition on select areas of the articles so coated may be effected to permit welding, electrical energy or heat conduction or other characteristic associated with the operation of the article or the assembly including the article. The technique of such selective deposition of diamond and/or chrome plating or the selective area removal thereof may be employed in the fabrication of various electrical devices, assemblies and integrated circuits of synthetic diamond and other materials.

2. Synthetic diamond may be coated, as described, onto electrical components which are subject to electrical discharge such as arcing, glow discharge, electron beam generating discharge, and current flow which results in intense enough heating to cause heat corrosion and erosion which ordinarily degrades the component with time rendering it less efficient in operation and/or requiring its replacement. Since such synthetic diamond is an excellent insulator of heat while a suitable conductor of electricity for many applications, it may be employed to form or comprise a component of electrodes, discharge device filaments, lasing devices for intense light energy, electrical contacts, so call points such as ignition contacts, switch components such as pivoting and sliding contacts, sliding electrical connectors for electrical devices and electronic circuit and the like. Such components may be fabricated of metal, carbon or other material which conducts electricity or lases, which may be disposed per se or after assembly with other components or deposition preventing covers in the chambers 52 or 91 for coating with synthetic diamond by one of the techniques described.

3. Assemblies of two or more components requiring synthetic diamond coating or coatings may be disposed in chambers 52 or 91 of FIGS. 3 and 5, which chambers are modified to permit such assemblies to be tumbled therein as the chambers rotate to effect the deposition of synthetic diamond film, as described, on substantially the entire outer surfaces of such assemblies to serve to protect and strengthen the components of such assemblies and to better seal and bond them together by extending across the interfacial portions of the assemblies.

4. Dynamic and static pressure seals, such as metal and ceramic lip seals, hollow or solid ring seals, wedge seals, V-seals and the like may be fabricated of a base metal or ceramic and coated with synthetic diamond, as described, with or without an outer coating of a solid lubricating material such as chromium covering the entire seal or at least the portion thereof subject to wear.

4. Other objects and articles which are subject to surface attrition and/or heat corrosion during use, such as threaded fasteners, fastening pins and nails, fastener retainers, slide fasteners, rivets, washers, nuts, inserts, staples, studs, grommetsbolts and screws may be completely or partly coated with hard diamond film by means of the apparatus of FIG. 3 or 5, with or without an overcoating of chromium or the like for wear resistance. A hard synthetic diamond film deposited on the threads of a threaded fastener will serve to reinforce and prevent thread failure due to chemical and/or heat corrosion and to strengthen the fastener. By applying such a synthetic diamond film to the head and/or other exposed postion of a fastener, heat and/or chemical corrosion thereof will be reduced or eliminated during use. Such synthetic diamond film extending between and across fastener components and/or between a portion or portions of the fastener and the work or components fastened therewith, will also serve as an effective seal and bonding means.

5. Gears, gear teeth and the like coated with synthetic diamond film with or without an overcoating or plating of chromium for reducing friction and frictional wear during use when the gear teeth mesh with the teeth of other gears, may be thus improved in strength, wear resistance and performance. The entire gear including all of its teeth, sidewall and central hole or hub may contain a coating of synthetic diamond or the teeth of the gear, particularly the surfaces thereof which are subject to wear during use, may be so coated.

6. Filaments for use in electrical discharge devices, such as incandescent lamps, glow discharge devices and the like, may also be coated, as described, either entirely or only the operatively heated portion thereof, with synthetic diamond film which is operable to protect same against heat corrosion and shock to extend the life thereof.

What is claimed is:

1. A method of coating particles with a hard surfacing material comprising:
    (a) levitating a plurality of particles of hard solid material in a reaction zone of a reaction chamber by upwardly directing a plurality of streams of a fluid formed of gas molecules containing carbon atoms through said reaction chamber and, while said particles are so levitated,
    (b) maintaining an above atmospheric gas pressure in said chamber and causing said particles to make contact with molecules of said fluid which molecules contain carbon atoms, and
    (c) passing radiant energy through the molecules of said fluid and against said particles while they are levitated, which radiant energy is operable to react on both said fluid molecules and said particles in a manner to cause carbon atoms of said fluid to deposit as a hard synthetic diamond layer completely surrounding and coating said particles to define the entire outer surface of each of said particles composed of synthetic diamond.

2. A method in accordance with claim 1 wherein said radiant energy is microwave energy which is generated at sufficient intensity and for a sufficient period of time to cause carbon atoms to be separated from molecules of said fluid and to form a film of synthetic diamond which completely surrounds each of the particles against which said carbon atoms are deposited.

3. A method in accordance with claim 1 which includes forming and supplying said fluid to said reaction chamber as a mixture of gas molecules and fine droplets of a vapor formed from a carbon atom containing compound selected from the group of compounds including methanol, ethanol and acetone.

4. A method for coating small objects, such as articles of manufacture and small particles with synthetic diamond comprising:
    (a) disposing a multitude of solid objects within a reaction chamber which is supported for rotation and is internally shaped to carry objects disposed therein from a low point during its rotation to a higher point at which objects carried to said higher point may be released and will fall freely through said chamber as the chamber rotates,
    (b) disposing a fluid formed of molecules containing carbon atoms within the chamber and operable to contact said objects during their conveyance and free fall through said chamber,
    (c) generating and directing microwave energy through said chamber as the chamber rotates at an intensity and so directed to cause said microwave energy to intersect molecules of said fluid and said objects during the free fall of said objects through said chamber and to cause atoms of carbon to be separated from their molecules and to deposit as a film on the surfaces of the objects as they fall through said chamber in a manner to bond said carbon atoms to the surfaces of said objects and to form a hard diamond coating thereon.

5. A method for forming synthetic diamond coatings on particles which coatings define a hard surfacing wear resistant material comprising:
    (a) admitting a plurality of solid hard particles to a reaction chamber containing a gas at an above atmospheric pressure and having molecules containing carbon atoms and causing said particles to be disposed freely in the gas of said chamber and apart from each other during at least part of the time they are disposed in said chamber while said gas is pressurized above the pressure of the atmosphere,
    (b) causing said solid hard particles to make contact with molecules of said gas containing said carbon atoms, and
    (c) passing microwave energy through the interior of said chamber to cause said microwave energy to intersect molecules of said pressuring gas and said particles, which microwave energy is generated at sufficient intensity and for a sufficient period of time to react on said gas in a manner to cause carbon atoms of said gas to deposit and form a hard synthetic diamond coating on said particles.

6. A method in accordance with claim 5 wherein said microwave energy is generated at sufficient intensity and for a sufficient period of time to cause carbon atoms of said molecules of said gas to be separated from their molecules and to form a thin film of synthetic diamond which completely surrounds and is bonded to each of said particles.

7. A method of coating particles comprising:

(a) levitating a plurality of solid particles and, while said particles are so levitated, (b) causing said particles to make contact with molecules of a gas which is pressurized above atmospheric pressure and contains carbon atoms, and (c) passing microwave energy through said gas and against said particles, which microwave energy is operable to heat said pressurized gas and said particles in a manner to cause carbon atoms of the molecules of said gas to deposit as a coating of synthetic diamond completely surrounding said particles.

8. A method for coating small objects, such as articles of manufacture, particles and the like, comprising:

(a) disposing a multitude of small solid objects within a reaction chamber, which chamber is supported for rotation and is internally shaped to carry objects disposed therein from a low point during its rotation to a higher point, at which higher point objects carried thereto by the rotation of said chamber are released and fall freely through said chamber, (b) pressuring to a fluid pressure above atmospheric pressure a gas containing molecules having carbon atoms and disposing said pressurized gas within said chamber, (c) while said gas is disposed in said chamber at above atmospheric pressure with said particles, generating and directing microwave energy through said chamber while rotating said chamber in a manner to cause said small objects to fall freely through said gas in said chamber wherein the intensity of said microwave radiation is sufficient to cause atoms of said pressurized gas molecules to be separated from said gas and to deposit as hard film of synthetic diamond on the surfaces of said objects as said objects fall through said chamber and wherein said microwave energy is also operable to effect the bonding of said synthetic diamond film to the surfaces of said objects.

9. A method for coating particles and the like comprising:

(a) disposing a multitude of metal particles in a reaction chamber, which chamber is supported for rotation and is internally shaped to carry said particles, while rotating, to a higher point at which particles carried to said higher point are released and fall freely through said chamber as it is rotated, (b) pressuring a gas formed of molecules containing carbon atoms to a pressure which is above atmospheric pressure within said chamber wherein the molecules of said pressurized gas contact said metal particles during their free fall through said chamber, (c) generating and directing microwave energy through said chamber while rotating said chamber to cause said radiant energy to intersect molecules of said gas and said metal particles as said particles fall freely through said chamber so as to cause carbon atoms of said gas to be removed from their molecules and to deposit onto the surfaces of said metal particles as they fall downwardly through said chamber and to bond said carbon atoms to said particles and form synthetic diamond coatings thereof on said particles.

* * * * *